(12) United States Patent
Edelstein et al.

(10) Patent No.: US 7,898,247 B2
(45) Date of Patent: Mar. 1, 2011

(54) MAGNETIC SENSOR METHOD AND APPARATUS

(75) Inventors: Alan Shane Edelstein, Alexandria, VA (US); William S. Coblenz, Arlington, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 95 days.

(21) Appl. No.: 12/365,398

(22) Filed: Feb. 4, 2009

(65) Prior Publication Data

US 2010/0231211 A1    Sep. 16, 2010

(51) Int. Cl.
*G01R 33/02* (2006.01)
(52) U.S. Cl. ...................... 324/244; 324/260
(58) Field of Classification Search ............... 324/244, 324/260
See application file for complete search history.

(56) References Cited

U.S. PATENT DOCUMENTS

| | | | |
|---|---|---|---|
| 4,864,237 A | 9/1989 | Hoenig | |
| 5,942,895 A | 8/1999 | Popovic et al. | |
| 6,501,268 B1 | 12/2002 | Edelstein et al. | |
| 6,670,805 B1 | 12/2003 | Bahr et al. | |
| 6,670,809 B1 | 12/2003 | Edelstein et al. | |
| 7,002,339 B2 * | 2/2006 | Kawashima et al. | ... 324/207.25 |
| 7,046,002 B1 | 5/2006 | Edelstein | |
| 7,185,541 B1 | 3/2007 | Edelstein | |
| 7,195,945 B1 | 3/2007 | Edelstein | |

OTHER PUBLICATIONS

Guedes, et al., "Hybrid magnetoresistive/microelectromechanical devices for static field modulation and sensor 1/f noise cancellation," Journal of Applied Physics 103, 07E924 (Mar. 2008).
R. J. M. van de Veerdonk et al., "1/f noise in anisotropic and giant magnetoresistive elements," J. Appl. Phys., vol. 82, p. 6152, 1997.
Edelstein, et al., "Minimizing the Effect of 1/f Noise with a MEMS Flux Concentrator" Sensors, 2004. Proceedings of IEEE Oct. 24-27, 2004, pp. 1562-1565 vol. 3 ISBN: 0-7803-8692-2.

(Continued)

*Primary Examiner* — Reena Aurora
(74) *Attorney, Agent, or Firm* — Lawrence E. Anderson

(57) ABSTRACT

A magnetic field sensing device comprising at least one magnetic sensor attached to a base structure, rotating member; and at least one flux concentrator mounted on the rotating member; whereby as the rotating member turns, the at least one flux concentrator shields the magnetic sensor so as to modulate the output of the at least one magnetic sensor. A second embodiment comprises a rotating member that rotates about an axis with at least one flux concentrator positioned thereon having a longitudinal axis in the radial direction of the rotating member; and at least one vector-type magnetic sensor fixedly mounted in the near proximity to the axis of the rotating member such that the magnetic field detected is modulated due to the rotation of the rotating member. Optionally, at least one fixed flux concentrator may be positioned along the periphery of the rotating member so as to increase magnetic flux input.

20 Claims, 9 Drawing Sheets

OTHER PUBLICATIONS

Edelstein, et al., "Minimizing 1/f Noise in Magnetic Sensors With a MEMS Flux Concentrator," Dec. 2004, DTIC handle.dtic.mil/100.2/ADA409302.

Edelstein, et al., "The MEMS Flux Concentrator: Potential Low-Cost, Highsensitivity Magnetometer" Nov. 1, 2006, DTIC handle.dtic.mil/100.2/ADA481427, Defense Technical Information CenterAccession No. ADA481427.

Edelstein, et al., "Progress toward a thousandfold reduction in 1/f noise in magnetic sensors using an ac microelectromechanical system flux concentrator," J. Appl. Phys., 99, 08B317/1-6 (Apr. 27, 2006).

Edelstein, et al."Minimizing 1/f noise in magnetic sensors using a microelectromechanical system flux concentrator," J. Appl. Phys., 91, 7795-7797 (2002).

Edelstein, et al., "Minimizing 1/f Noise in Magnetic Sensors using an AC MEMS Flux Concentrator," Materials Research Society Fall 2005 Meeting.

Burnette, et al. "Initial studies on microelectromechanical system flux concentrators," Journal of Applied Physics 103, 07E930 (Mar. 2008).

Guedes, et al. "Hybrid—Low Cost, Low Power, High Sensitivity Magnetometer," Dec. 1, 2008, DTIC document [URL http://www.dtic.mil/cgi-bin/GetTRDoc?AD=ADA503403&Location=U2&doc=GetTRDoc.pdf].

Smith, N. et al. "Very high sensitivity GMR spin-valve magnetometer," Magnetics, IEEE Transactions on, vol. 33, No. 5, pp. 3385-3387, Sep. 1997.

Bondarenko, S. I., et al. "Features of amplification of dipole magnetic field with linear ferromagnetic concentrator," Rev. Sci. Inst. (2006), 77, pp. 094701(4).

P.M. Drljaca, "Design of Planar Magnetic Concentrators for High Sensitivity Hall Devices," Sensors and Actuators A, 2002, 97-98 10.

* cited by examiner

MAGNETIC SENSOR METHOD AND APPARATUS

GOVERNMENT INTEREST

The invention described herein may be manufactured, used, and licensed by or for the United States Government.

FIELD OF THE INVENTION

The present invention relates generally to magnetic transducers, and more particularly, to magnetic sensors used with a flux concentrator that modulates the magnetic flux going to the magnetic sensor.

BACKGROUND OF THE INVENTION

This invention relates to magnetic field sensors, and the detection and location of the approximate position of ferromagnetic objects, such as, for example, in the path of a vehicle or of drilling equipment before the vehicle or drill reaches the object, or for measuring cardiac signals.

Interest is increasing in the development of magnetic sensors for sensing low-frequency magnetic fields in terrestrial, extraterrestrial, industrial, biomedical, oceanographic, and environmental applications. The trend in magnetic sensor design and development is constantly toward lower size, lower power consumption, and lower cost for similar or improved performance.

There are several types of magnetometers (magnetic sensors with external instrumentation) currently used. The least expensive and least sensitive devices have resolution of about 1CT1 Oersted (Oe)/Hz½ and typically are Hall effect devices. These devices work by sensing a voltage change across a conductor or semiconductor placed in a magnetic field. Such devices are insensitive and do not lend themselves to applications requiring greater sensitivity, such as that required in brain scan devices and magnetic anomaly detection devices. Magnetoresistive-type magnetic sensors are suited for low-cost, medium-sensitivity applications and have a detectivity of about 0.1-1 nT/Hz$^{1/2}$ at 1 Hz. Using spin-dependent tunneling magnetoresistive sensors, one can observe more than 100% changes in the resistivity in fields of a few Oe.----.

More sensitive magnetometers exist, but they are typically limited to applications that can tolerate relatively high power size, weight and cost. The most common of these devices are flux gate magnetometers that have a resolution of approximately 0.05-0.1 nT Oe/Hz$^{1/2}$ at 1 Hz and SQUID (superconducting quantum interference device) magnetometers that have a resolution of about 3-50 fT Oe/Hz$^{1/2}$ at 1 Hz. Flux gate magnetometers use a magnetic core surrounded by an electromagnetic coil, and are difficult to micro fabricate and have less sensitivity when made very small because the magnetic flux change is smaller. Additionally, flux gate magnetometers require relatively large amount of power and accordingly do no lend themselves to low-cost, compact, portable design. Though SQUID magnetometers are sensitive magnetometers, the apparatus must include a means for cooling to cryogenic temperatures. This makes SQUID magnetometers extremely bulky and expensive to operate. Their size limits their utility because the active superconducting element cannot be placed directly adjacent to the source of the magnetic field, for example the brain. Accordingly, there is need for inexpensive, low power magnetometers that have sufficient sensitivity to be useful for a variety of magnetometer applications at relevant frequencies.

Magnetic sensors used to detect objects that move slowly typically exhibit considerable low-frequency 1/f-type noise (where f is frequency of operation of the magnetic sensor), an unwanted condition. In general, there is a tendency for such devices that have higher sensitivity to also exhibit higher 1/f-type noise. This generally occurs when using magnetoresistive-type magnetic sensors, see van de veer-donk et al. J. Appl. Phys 82, 6152 (1997).

A well-known way of increasing the sensed magnetic field by a magnetic sensor is by use of a flux concentrator, which can enhance a sensed magnetic field by as much as a factor of 50, see N. Smith et al., IEEE Trans. Magn. 33, p. 3358 (1997). An example of such a device is taught in U.S. Pat. No. 5,942,895, entitled "Magnetic field sensor and current and/or energy sensor," that uses Hall sensors with flux concentrator components. The magnetization of flux concentrators increases in the direction of the field to be measured. This in turn increases the magnetic field flux at the position of the sensor and, thus, increases the output signal from the magnetic sensor.

The magnetization of the flux concentrator can change by domain wall motion or domain rotation. The latter is the preferred mode because it generates less 1/f noise. There are many different ways and materials that can be used for the magnetic material. The overall objective is the largest possible increase in the magnetic field at the position of the sensor.

A magnetic sensor (magnetometer) that addresses 1/f-type noise is taught in U.S. Pat. No. 4,864,237. This disclosure teaches of an apparatus for measuring magnetic fields, which change only at extremely low frequency. This apparatus uses a SQUID magnetometer that includes a superconducting flux transformer that inductively couples a detected signal into a d-c SQUID sensor. This magnetometer can optionally include a device for modulating the detected signal in a frequency range characteristic of low-noise operation of the SQUID. The modulation frequencies are generally above 1 Hz and optionally even above 1-kHz. Limitations of this device include need for cryogenic operation, which inherently do not lend themselves to relatively low cost, low power use.

U.S. Pat. No. 6,501,268, hereby incorporated by reference, by Edelstein entitled "Magnetic Sensor With Modulating Flux Concentrator for 1/f Noise Reduction," discloses a magnetic sensing device that senses low frequency magnetic fields by using movable flux concentrators that modulate the observed low frequency signal. The concentrator oscillates at a modulation frequency much greater than the observed magnetic field being sensed by the device. The modulation shifts this observed signal to higher frequencies and thus minimizes the effect of the 1/f-type noise, due to the oscillatory motion of a microelectromechanical (MEMS)-type magnetic flux concentrator operated with a magnetic sensor. Modulating of the incoming signal shifts the operating frequency of the sensor. Depending upon the sensor, shifting the operating frequency may reduce the 1/f noise by one to three orders of magnitude at one Hz. At least one modulating flux concentrator is used with the magnetic sensor. Because of its size, this device is especially useful for applications where the space available for the sensor is extremely limited.

U.S. Pat. No. 6,670,809, hereby incorporated by reference, to Edelstein entitled "Magnetic Sensor With Modulating Flux Concentrator Having Minimized Air Resistance for 1/f Noise Reduction," discloses a magnetic sensing transducer device that senses low frequency magnetic fields by using flux concentrators that modulate the observed low frequency signal, thereby shifting this observed signal to higher frequencies and minimizing 1/f-type noise. This is accomplished by the oscillatory motion of a microelectromechanical (MEMS)-type magnetic flux concentrator operated with a magnetic sensor. At least one MEMS-type fabricated flux concentrator is used with the magnetic sensor. The concentrator oscillates at a modulation frequency much greater than the observed magnetic field being sensed by the device. The device includes a vacuum container for containing the base structure, the magnetic sensor the flux concentrators and the pair of complementary electrodes in a vacuum environment. The device uses flux concentrators that modulate an observed a low frequency magnetic field, thereby shifting this observed field to higher frequencies where the noise of the sensor is smaller to minimize 1/f-type noise. This is accomplished by using a flux concentrator on a microelectromechanical system(MEMS) structure. When the MEMS structure is energized, the oscillatory motion of the flux concentrators modulates the enhancement of the field at the position of the magnetic sensor. The dimensions of the flux concentrators typically encompass gross dimensions of 100 by 75 microns.

U.S. Pat. No. 7,195,945, hereby incorporated by reference, to Edelstein, et al., entitled "Minimizing the Effect of 1/f Noise with a MEMS Flux Concentrator," discloses a method of method of fabricating a MEMS device that includes forming a magnetic sensor over a SOI wafer which may include an epoxy layer; forming a pair of MEMS flux concentrators sandwiching the magnetic sensor; connecting an electrostatic comb drive to each of the flux concentrators; connecting a spring to the flux concentrators and the comb drive; performing a plurality of DRIE processes on the SOI wafer; and releasing the flux concentrators, the comb drive, and the spring from the SOI wafer. Another embodiment includes forming adhesive bumps and a magnetic sensor on a first wafer; forming a second wafer; forming a pair of MEMS flux concentrators, a pair of electrostatic comb drives, and at least one spring on the second wafer; bonding the second wafer to the adhesive bumps; and compressing the adhesive bumps using non-thermal means such as pressure only.

In the publication Guedes et al. "Low Cost, Low Power, High Sensitivity Magnetometer," J. Appl. Phys. 103. 07E924 (2008), there is disclosed a technique for removing environmental noise while using a MEMS flux concentrator. The environmental noise is removed by taking the difference between the reading of the sensor and a reference sensor that is separated from the sensor by a distance of 20 feet to one km. According to the publication, magnetic anomaly signals smaller than 1 pT have been detected by this technique upon removing the effect of environmental noise. In the Guedes et al. publication, two flux concentrators were used.

Although attempts have been made minimize the effect of 1/f noise, to completely optimize the magnetic sensors, one must also decrease the magnetic white noise. The white noise is proportional to the inverse of the volume of the ferromagnetic free layer of the sensor. Thus, one would like to use free layers with a large volume. It is difficult to use the MEMS approach to modulate the field in a large volume. Accordingly, there is a need for a magnetic sensor for applications which exceed the capacity of a MEMS structure and which will decrease the magnetic white noise.

SUMMARY OF INVENTION

A preferred embodiment of the present invention is useful for modulating a magnetic field in a large environment or volume. In this preferred embodiment, an array of sensors are positioned underneath a rotating disk. The disk contains at least one flux concentrator. The disk may be supported by a rotating shaft which is connected to a motor assembly, which causes it to rotate at a high number of revolutions per second, such as, for example, 3000 rpm. The sensors, located underneath the rotating disk, are stationary (preferably vector-type) sensors. Each sensor detects a field perpendicular to its longest axis. Each operates to detect a component of the magnetic field; with the exception of one or two sensors which will detect nothing when the magnetic field is parallel to the longitudinal axis of the sensor(s). The output of each sensor is split into x and y components. This division is based upon the orientation of each sensor relative to the x and y axis. Then the individual measured x and y components of all the sensors are then added to determine the x and y components of the magnetic field. As the disk rotates, each time a flux concentrator passes over a sensor the flux concentrator largely shields that sensor because the magnetic field is effectively diverted from the sensor into the flux concentrator. Each time the sensors are between the gaps as shown in FIG. 1, the sensors experience an enhanced magnetic field due to the effect of the flux concentrators. When the flux concentrators are positioned substantially over the sensors, the soft ferromagnetic material of the flux concentrators shields the sensors from the magnetic field. As the disk with the flux concentrators rotates, the flux concentrators in effect modulate the field at the position of the sensors. Note because of the geometry all the sensor are shielded at the same time and all of them sense the enhanced field at the same time.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

Figure 1:
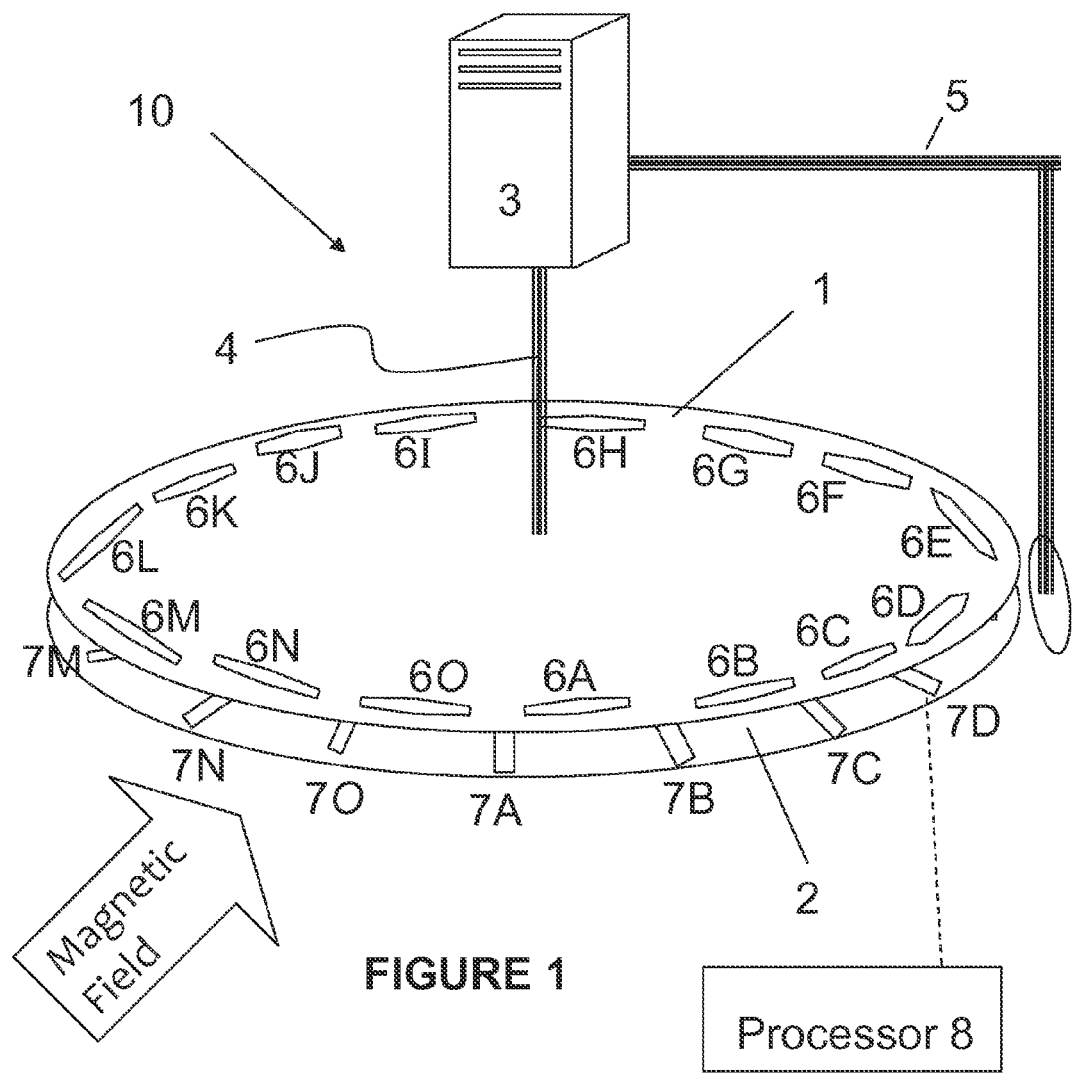
FIG. 1 is a schematic diagram of a preferred embodiment of the present invention.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

FIG. 1 illustrates a preferred embodiment device 10 incorporating the concepts of the present invention for sensing and modulating a magnetic field. In this preferred embodiment, a rotating member 1 is mounted on a shaft 4 that is driven by a motor 3, which is in turn mounted on a support 5. The rotating member may be, as an example, a disk which may be 10 cm. in diameter. It can be readily appreciated by those of ordinary skill in the art that any type of motor or propulsion assembly may be used to rotate disk 1 and the items pictured are merely to show an example of one such method. As seen in FIG. 1, mounted on the disk 1 are flux concentrators 6A through 6O. The flux concentrators may comprise a film formed of soft ferromagnetic material, for example. A suitable film which is cost effective is formed of an alloy that is eighty atomic percent nickel and twenty atomic percent iron. This alloy is often called permalloy. As an exemplary fabrication technique, the flux concentrators may be formed by depositing a permalloy on the disk 1.

Figure 2:
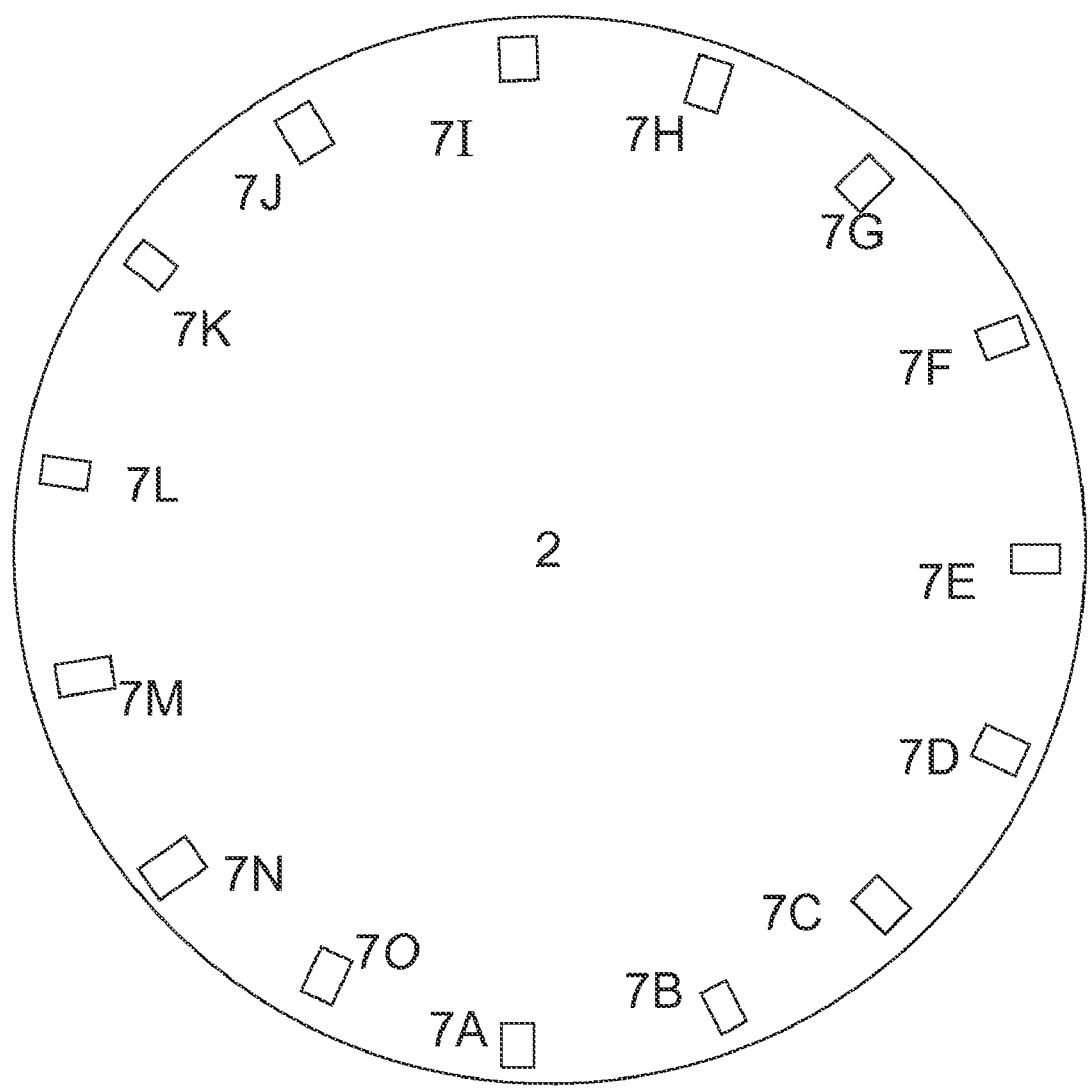
FIG. 2 is a top view, cut-away view (with the upper disk removed) of a lower disk upon which sensors are mounted.

As seen in FIG. 2, an array of sensors 7A to 7O are positioned underneath the rotating disk 1, in spaced apart fashion on a stationary disk 2. The sensors are interconnected by circuitry (not shown) such that their outputs are processed by a processor 8. It can be readily appreciated by those skilled in the art that the sensors may be positioned or supported by an object other than a disk without departing from the scope of the present invention. The magnetic sensors 7 may comprise one of a Hall effect type sensor, a magnetoresistive sensor, a MEMS sensor, a magneto-diode, a magneto-transistor, a MAGFET, a fluxgate, a miniature fluxgate magnetometer, a SQUID and/or a magneto-optical sensor.

By way of background, according to Wikipedia, a magnetometer is device used to measure the intensity and direction of a magnetic field. Magnetometers may be classified as either scalar or vector instruments. A scalar magnetometer measures the strength of the total magnetic field, whereas a vector magnetometer measures one or more vector components of the magnetic field. Sensors 7 are of the vector type. Three modern devices in regular use are the nuclear magnetometer, fluxgate magnetometer, and SQUID magnetometer.

Figure 3:
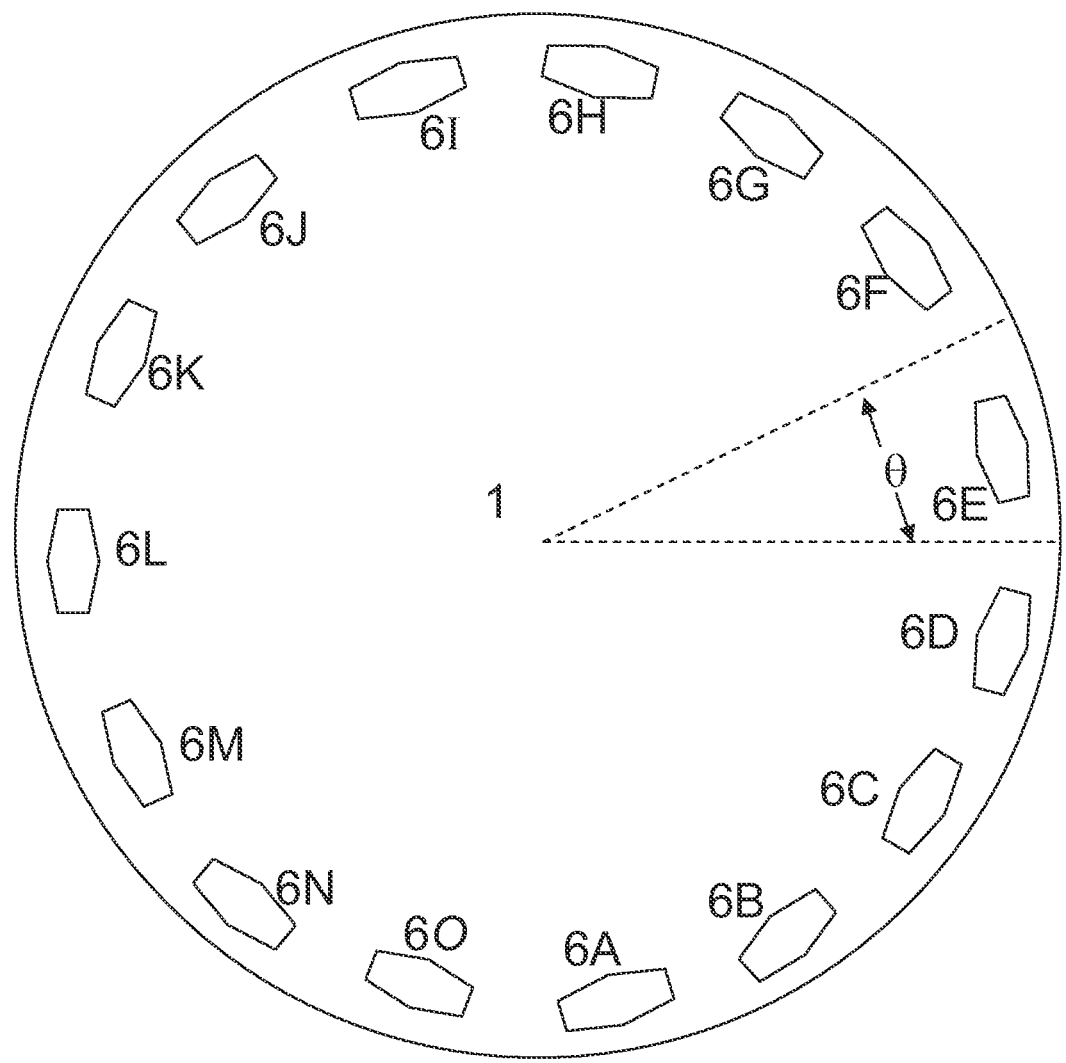
FIG. 3 is an illustration of an upper, rotable disk with flux concentrators mounted along the circumference.

Moreover, although this preferred embodiment utilizes a rotating disk 1 and stationary disk 2, disk 2 could rotated while disk one remains stationary without departing from the principles of the present invention. As exemplified in the embodiment shown in FIG. 1, the disk 1 is rotated by motor assembly 3 at a high number of revolutions per second, such as, for example, 3000 rpm. The stationary sensors 7A through 7O, located underneath the rotating disk, each detect a field perpendicular to the longitudinal axis of the respective sensor. Each sensor 7A-7O operates to detect a component of the magnetic field. As seen in FIG. 3, flux concentrators 6A through 6O are positioned along the circumference of disk 1 at equally spaced intervals. It can be readily appreciated by those of ordinary skill in the art that the number of sensors 7A through 7O and flux concentrators may be varied without departing from the scope of the present invention.

Figure 4:
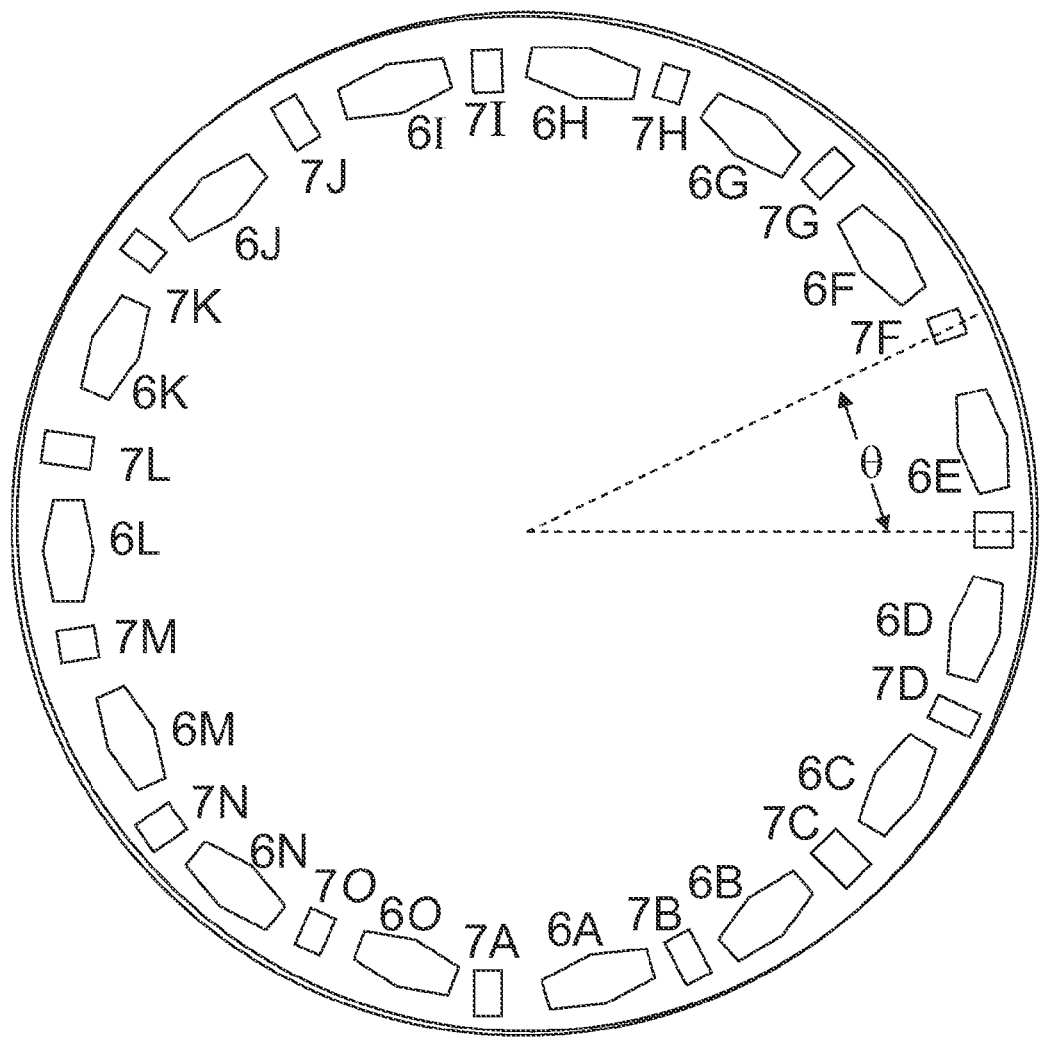
FIG. 4 is a schematic view of the upper disk superimposed over the lower disk at a time when the flux concentrators are positioned over the spaces in between the sensors.
Figure 5:
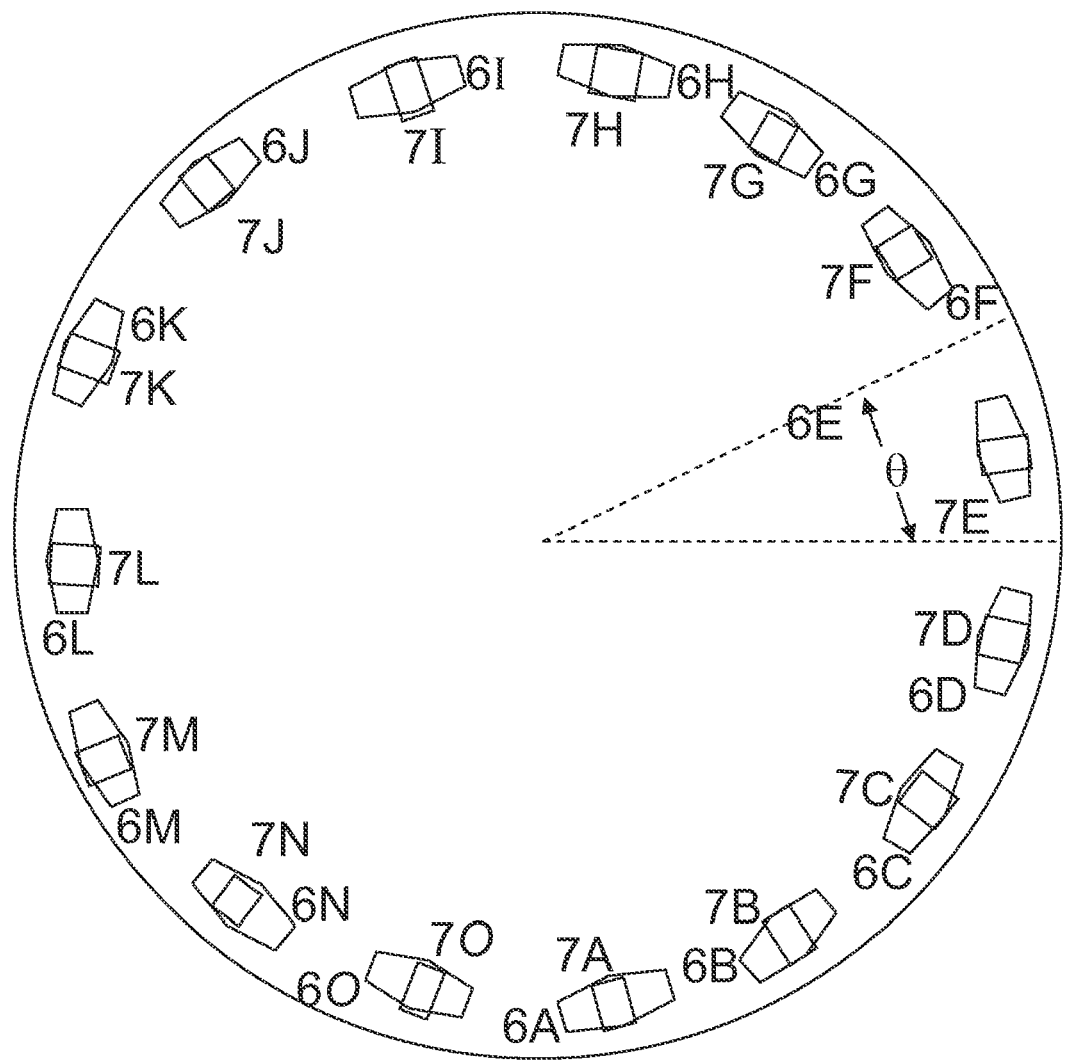
FIG. 5 is a schematic view of the upper disk superimposed over the lower disk at a time when the flux concentrators are positioned over the sensors.

FIG. 4 is a schematic illustration of the assembly 10 of FIG. 1 showing only the flux concentrators 6A through 6O superimposed over the sensors 7A through 7O on disk 2. As used herein, when the flux concentrators 6 are in the position depicted in FIG. 4, they are said to be "in alignment with" the sensors 7. In effect, disk 1 has been made transparent in order to facilitate a visualization of the operation of the sensors vis-á-vis the position of the flux concentrators 7. However, in actuality, the disk 1 would cover the sensors 6 and preclude observation in this manner. As the disk 1 rotates, when the flux concentrator 6 are located in the gaps between the sensors 7 as shown in FIG. 4, the intensity of the magnetic field detected by the sensors 7 is at a maximum. As the disk rotates an angle of θ/2 (one half θ), as shown in FIG. 5, the flux concentrators 6 are positioned over the sensors 7, which effectively shields the sensors 6 from most of the magnetic field. Each time a flux concentrator 6 shields the sensor 7 in the manner shown in FIG. 5, the magnetic field is effectively diverted from the sensor into the flux concentrator. The soft ferromagnetic material of the flux concentrators 7 shields the sensors from the magnetic field. When the disk with the flux concentrators shown in FIG. 3 rotate, the flux concentrators modulate the field at the position of the sensors and, hence, also modulate output of the sensors to processor 8. Each time the sensors are between the gaps of the flux concentrators 6, as shown in FIG. 4, they experiences an enhanced magnetic field due to the flux concentrators. Upon a rotation of θ/2 (one half θ), the magnetic field is minimized.

Accordingly, the magnetic field detected at the processor 8 is modulated from a minimum magnetic field as the rotating member rotates from a first position shown in FIG. 5 when each of the sensors 7A-O is in alignment with each of the flux concentrators 6A-O on the rotating member 1 to a maximum magnetic field at a second position, as shown in FIG. 4 when each of the sensors 7A-O is not in alignment with each of the flux concentrators 6A-O on the rotating member 1.

Figure 6:
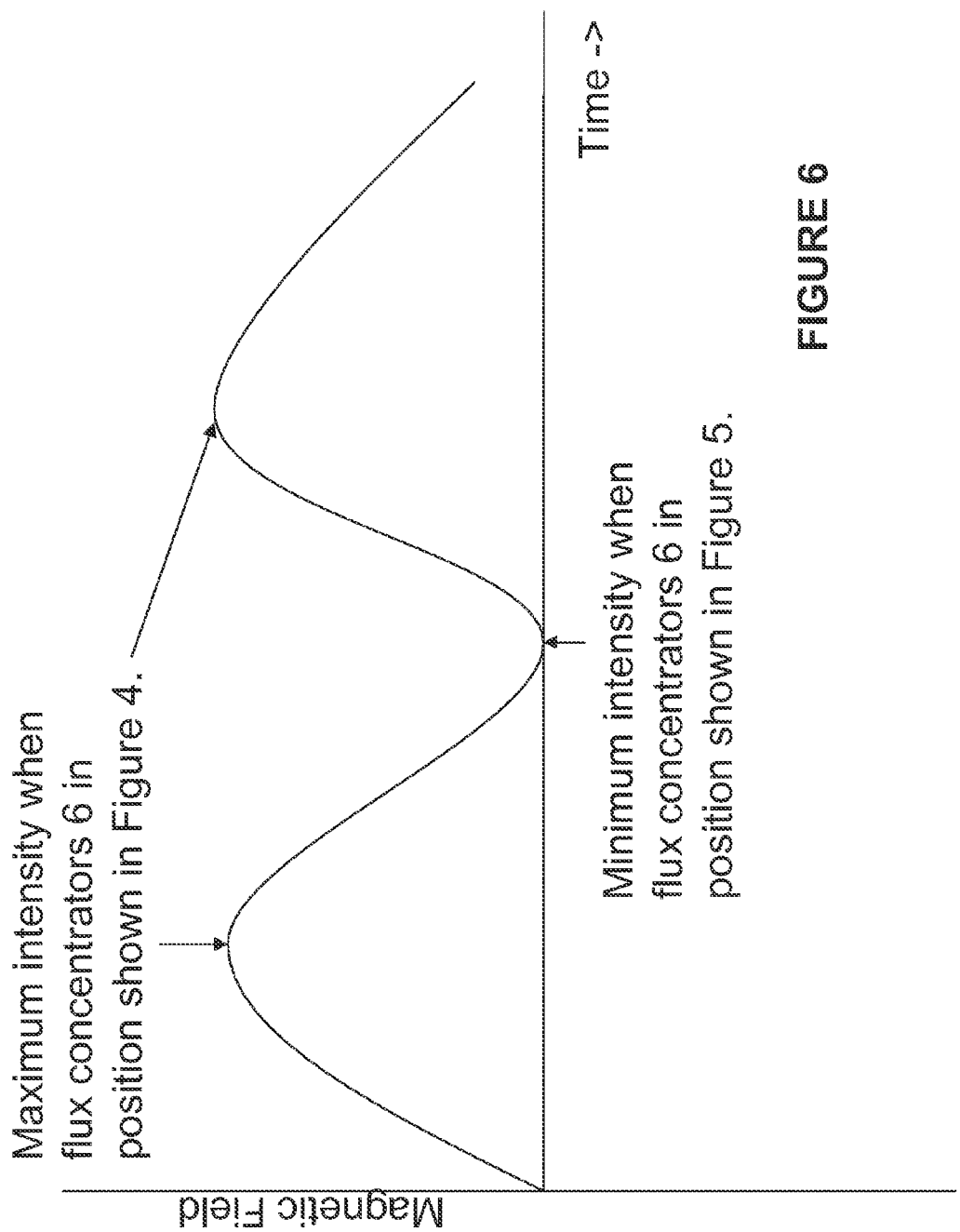
FIG. 6 is a graphical representation of the modulation of the magnetic flux detected by the sensors of the embodiment of FIG. 1.

Accordingly, the number of flux concentrators and the speed of rotation (RPMs) determine the frequency of the modulation. As shown in FIG. 6, the output of the sensors 7 to the processor 8 is sinusoidal-like.

The device 10 will determine two vector components of the magnetic field. The two vector components of the magnetic field are determined from $$H_x = \Sigma S_i \sin(\theta_i)$$

$$H_y = \Sigma S_i \cos(\theta_i)$$

Where $\theta_i$ is the angle between the long dimension of the sensor and the x-axis and the sum is over all the sensor signals $S_i$ from the sensors 7A-7O.

Alternatively, one can make the system into a two vector component gradiometer by replacing the quantities $S_i$ in Eq. 1 with the differences of the signals from pairs of sensors that are opposite from one another on the disk, i.e., if one sensor has $\theta = \theta_i$, then the other sensor has $\theta = \theta_i + \pi$.

Figure 7:
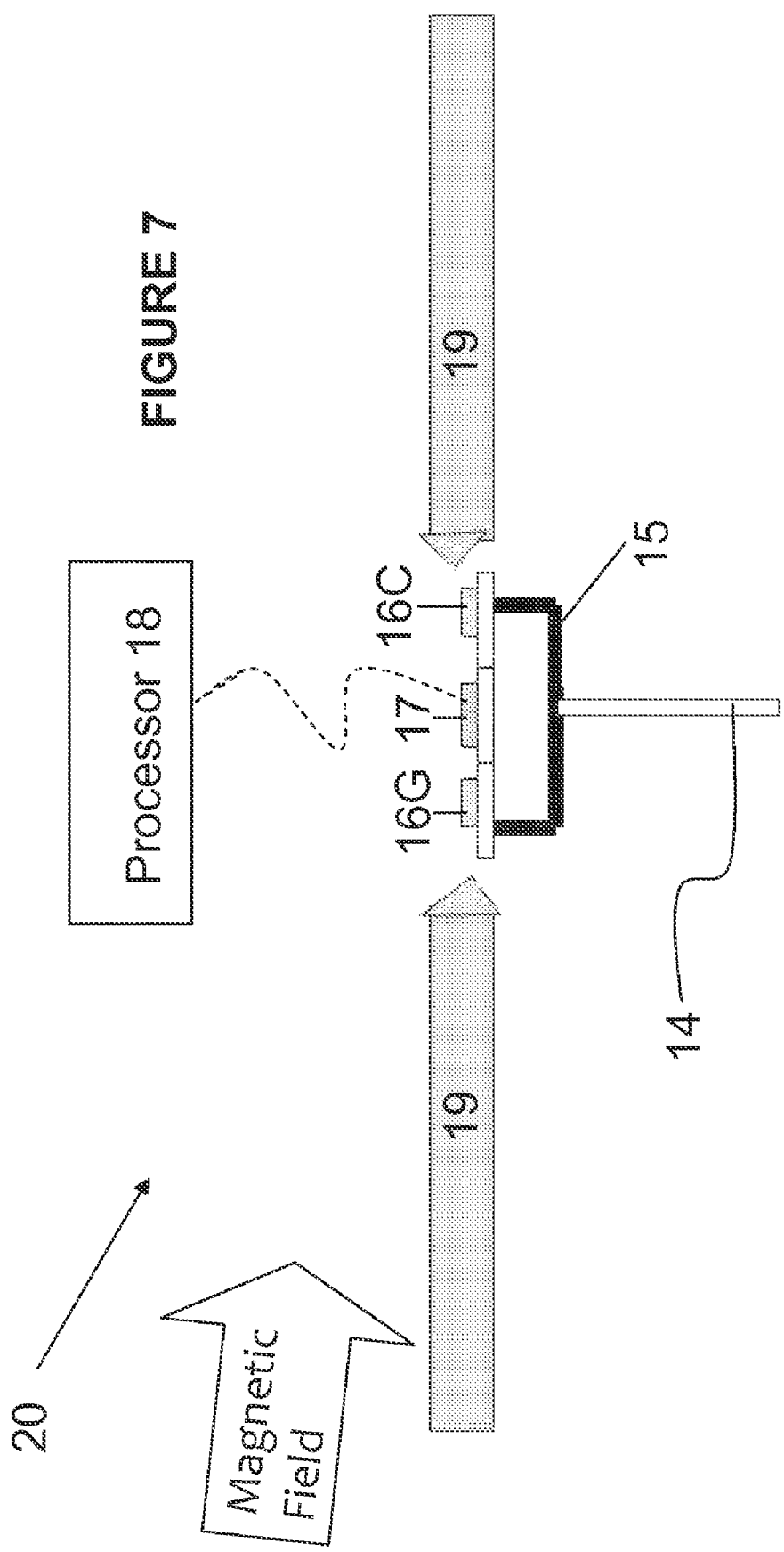
FIG. 7 is a schematic diagram of a second preferred embodiment of the present invention showing a side view.
Figure 8:
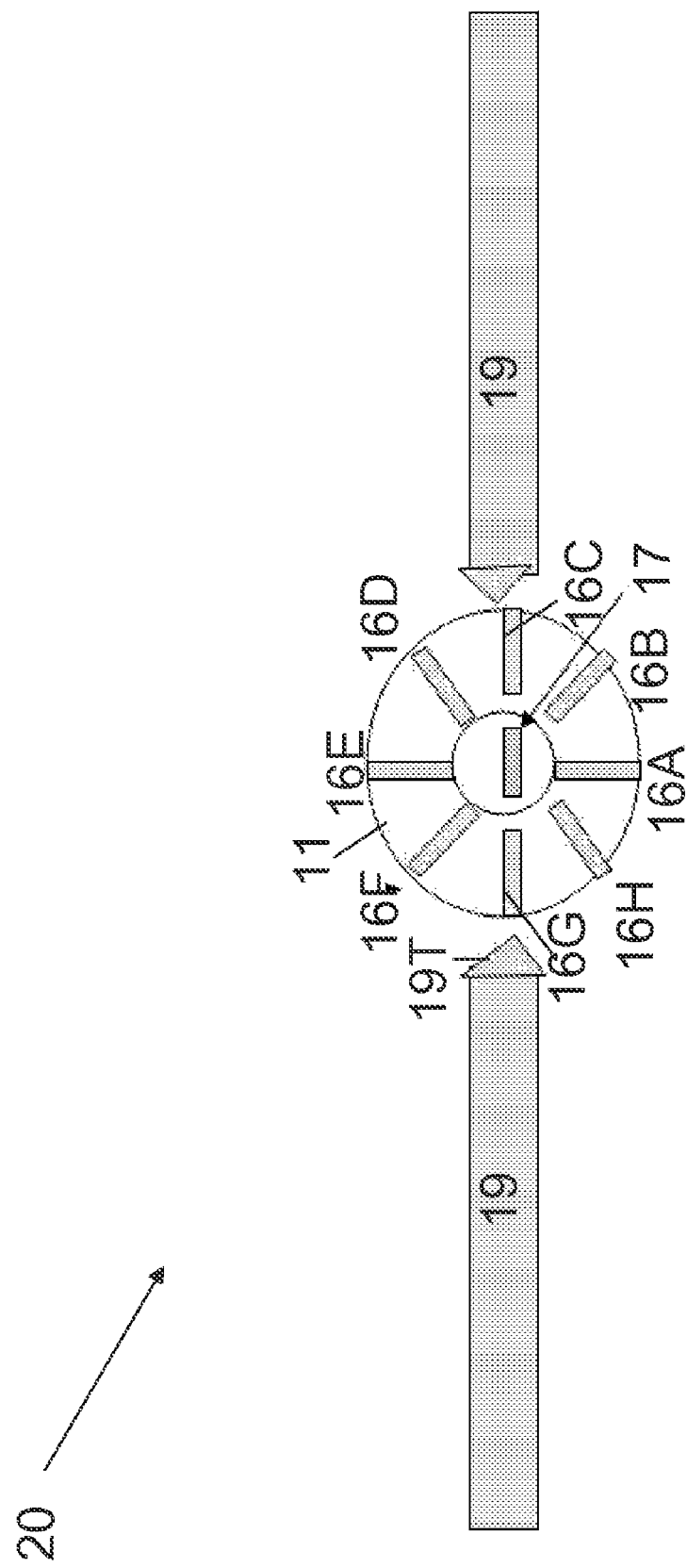
FIG. 8 is a schematic diagram of a second preferred embodiment of the present invention showing a top view in a first position at which the magnetic field detected by the sensor 17 is at a maximum.
Figure 9:
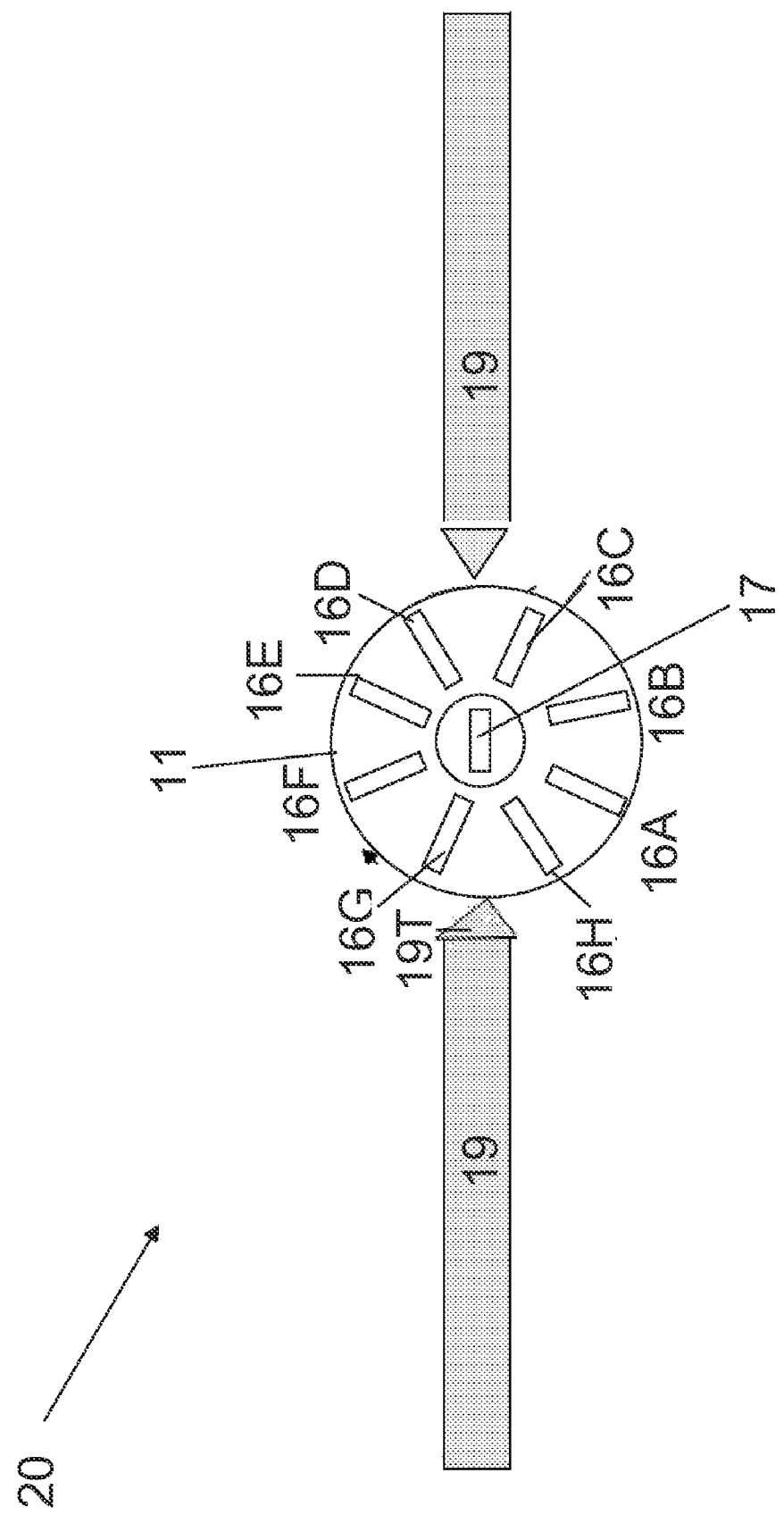
FIG. 9 is a schematic diagram of a second preferred embodiment of the present invention showing a top view in a second position at which the magnetic field detected by the sensor 17 is at a minimum.

FIGS. 7 through 9 illustrate an alternative preferred embodiment that employs a type of compound flux concentrator. The compound flux concentrators consists of two types of flux concentrators, large flux concentrators 19 and that may provide an enhancement of exceeding 100 and a set of smaller flux concentrators 17 that rotate on disk 11. The support for the sensor 17 is not shown. By rotating the disk field at the position of the sensor, the magnetic field will be modulated because the smaller flux concentrators are needed to focus the field at the position of the sensor. The modulation frequency will be larger than the rotation frequency because of the number of small flux concentrators (17A-17H) on the disk.

In this embodiment, a vector sensor 17 is fixedly positioned central to a rotating disk 21 and is operatively connected to a processor 8, the circuitry of which is not shown. The magnetic sensor 17 may comprise one of a Hall effect type sensor, a magnetoresistive sensor, a MEMS sensor, a magneto-diode, a magneto-transistor, a MAGFET, a fluxgate, a miniature fluxgate magnetometer, a SQUID and/or a magneto-optical sensor. Disk 21 may be supported by a frame member 15 onto a rotating shaft 14 which is operatively connected to a rotational power source such as a motor or the like. Although the disk 21 is supported below the disk 21, one of ordinary skill in the art could readily appreciate that the support structure and shaft 14 could be positioned above or along the side of the disk without departing from the scope of the invention. Similarly, the disk 21 could be replaced by a rotating object of another configuration. As shown in FIG. 8, flux concentrators 16 are equally spaced in spoke-like fashion on disk 21. The longitudinal axis of the each flux concentrator is positioned in a radial direction vis a vis the disk 21. The flux concentrators 16 may comprise a film formed of soft ferromagnetic material, for example. A suitable film which is cost effective is formed of permalloy an alloy of eighty atomic percent nickel and twenty atomic percent iron. As an exemplary fabrication technique, the flux concentrators may be formed by depositing a permalloy on the disk 11. Device 20 further comprises fixed flux concentrators 19, positioned adjacent to the rotating disk 11 so as to transfer the magnetic field, as represented by an arrow in FIG. 7, to the flux concentrator 16A to 16H positioned on the disk 11. As shown in FIG. 8, flux concentrators 19 may be cylindrical with a solid or hollow interior. Flux concentrators may include converging tips 19T, as shown in FIG. 8. One of ordinary skill in the art could readily appreciate that the flux concentrators 16 and 19 could be a variety of configurations without departing from the scope of the present invention and that the configurations shown are merely exemplary. Flux concentrators 16 either effectively guide or focus the field at the position of the sensor when they are in the position shown in FIG. 8 or do it less efficiently as when they are at the position shown in FIG. 9. Thus, this device 20 also will modulate the field when the disk rotates thereby can be used to minimize the effect of 1/f noise. Using Nowak's estimate the of the magnetic 1/f noise as a function of the volume of magnetic element, assuming $B_{sat}$=100 Oe (which is the case for materials such as Metglas) the volume required to reach $10^{-13}$ Tesla/Hz$^{1/2}$ would be reduced to approximately $10^4$ cm., which is still significantly larger than desired. By using flux concentrators, a gain approaching 100 may be attained, which may in turn reduce the volume to 1 cm.$^3$ In general, moving flux concentrators are beneficial to magnetic sensors by (1) increasing the field at the position of the sensor and (2) by modulating the field to mitigate the effect of 1/f noise. The enhancement of the field has been demonstrated by several groups ((Bondarenko, S. I., Rev. Sci. Inst. 2006, 77, 094701, P.M. Drljaca, *Sensors and Actuators A*, 2002, 97-98 10). It is theoretically possible to get enhancements of the field by more than a factor of 100 with flux concentrators.

As shown in FIGS. 8 and 9, the vector-type magnetic sensor output is modulated as the rotating member 11 rotates from a first position shown in FIG. 8, when the at least one fixed flux concentrator is nearest and in alignment with the at least one flux concentrator on the rotating member to a second position shown in FIG. 9 where the at least one fixed flux concentrator is not in alignment with the at least one flux concentrator on the rotating member; the magnetic flux detected by the at least one vector-type magnetic sensor being at a maximum in the first position (FIG. 8) and at a minimum in the second position (FIG. 9).

The advantages of this invention include: (1) One can use larger sensors that have less white noise;. (2) it is convenient to have more than one sensor which again increases the S/N ratio; and (3) the modulation of the field at the positions of the sensors is synchronized. An alternative embodiment of the invention is to have the flux concentrators stationary and the sensors rotating.

It can be appreciated by those skilled in the art that the problem that the invention is designed to solve is the difficulty of modulating the field detected by large sensors. The reason one wants to be able to modulate the field at the position of large sensors is twofold. First, modulating the field shifts the operating frequency of the sensor to where 1/f noise is less significant. Second, using large sensors decreases white noise. Without using the capacity of a larger sensor, it is difficult to make nonoptically pumped sensors with a detectivity better that 1 pT/root Hz at 1 Hz.

Using the principles of the present invention result in improved performance of magnetic sensors. Magnetic sensors have many DOD and civilian applications including vehicle, arms and electrical equipment detection, mineral exploration, and rotational position determination. They also can be used to measure the magnetic signals from the heart.

It should be emphasized that the above-described embodiments are merely possible examples of implementations. Many variations and modifications may be made to the above-described embodiments. All such modifications and variations are intended to be included herein within the scope of the disclosure and protected by the following claims. The term "processor" or "computer" as used herein includes multiprocessors, computers, supercomputers, data processor, laptops, signal processors, personal computers, notebook computers, and/or any component which processes data. The abbreviation RF or rf is used for radio frequency or a radio frequency signal. As used herein, the term "equidistantly radially" means that the element is positioned radially in spoke-like fashion such that there are substantially an equal number of degrees between the members. As used herein, the terminology "being in alignment radially with [a or the] rotating member" means that, in the case of an element with a longitudinal axis, the longitudinal axis is positioned so as to overlap a line draw from the center of the object, such as a disk to its circumference so as to be perpendicular to a tangential line. As used herein and in the following claims, the terminology "the [elements] are . . . positioned equidistant along the circumference of the [rotating member or base]" means that if a circle is draw in the [rotating member or base] through the [elements (flux concentrators or sensors)], the [elements] are positioned such that there is substantially equal distance along the circumference of the circle between each [element]. In the case where the magnetic sensor is the vector-type, the terminology "the axis of the vector being in alignment radially with the rotating member" means that the vector denoting the direction of the magnetic field detected by the magnetic field detector is substantially parallel to a line drawn from the center of the rotating member to a point on the circumference of an imaginary circle drawn on the rotating member. As used herein, a fixed flux concentrator is are furthest from being in alignment with the at least one flux concentrator on the rotating member when in the position shown in FIG. 9. It will readily be appreciated by those of ordinary skill in the art that this will vary depending upon the number of flux concentrators on the rotating member or disk. For example, if there are two flux concentrators, the furthest point will occur after a ninety degree turn of the rotating member from the maximum.

The invention claimed is:

1. A modulating magnetic field device comprising:
   a base structure;
   a processor;
   at least one magnetic sensor operatively connected to the processor for detecting an external magnetic field;
   a rotating member which rotates relative to the base structure and the at least one magnetic sensor;
   at least one flux concentrator operatively connected to the rotating member;
   whereby as the rotating member turns, the at least one flux concentrator shields the magnetic sensor so as to modulate the output of the at least one magnetic sensor to the processor.

2. The device of claim 1 wherein each flux concentrator moves at a predetermined rotation rate to modulate the output of the at least one magnetic sensor at a frequency proportional to the rotation rate to thereby reduce 1/f-type noise.

3. The device as recited in claim 1, wherein the at least one magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

4. The device of claim 1 wherein the number of flux concentrators and magnetic sensors is at least 4.

5. The device of claim 1 wherein the rotating member is a disk.

6. The device of claim 1 wherein the magnetic field detected at the processor is modulated from a minimum magnetic field occurring when the rotating member is in a first position when the at least one magnetic sensor is nearest and in alignment with the at least one flux concentrator on the rotating member to a maximum magnetic field at a second position when the at least one magnetic sensor is not in alignment with the at least one flux concentrator on the rotating member.

7. The device of claim 1 wherein the at least one magnetic sensor transmits the intensity value of the magnetic field to the processor, and wherein the intensity value transmitted is modulated as the rotating member rotates from a first position when the at least one magnetic sensor is in alignment with the at least one flux concentrator on the rotating member to a second position when the at least one magnetic sensor is not in alignment with the at least one flux concentrator on the rotating member; the magnetic flux detected by the at least one vector-type magnetic sensor being at a minimum in the first position and at a maximum in the second position.

8. The device of claim 7, wherein there are at least two magnetic sensors and two flux concentrators which are positioned equidistant along the circumference of the rotating member; each magnetic sensor being a vector type with the axis of the vector being in alignment radially with the rotating member.

9. A method of modulating a magnetic field comprising:
rotating a member about its axis,
positioning at least one flux concentrator on the rotating member having a longitudinal axis in the radial direction of a the rotating member;
mounting at least one vector-type magnetic sensor in the near proximity to said axis;
operatively connecting the at least one vector-type sensor to a processor so as to provide output of the at least one sensor to the processor; the at least one magnetic sensor being configured to optimally detect a magnetic field in the direction of a predetermined vector;
whereby as the at least one flux concentrator revolves around the magnetic sensor, when the longitudinal axis of the at least one flux concentrator is in alignment with direction of the predetermined vector, the magnetic field flowing from the at least one flux concentrator to the at least one vector-type magnetic sensor is at a maximum and when the at least one flux concentrator rotates away from this aligned position, the flux flowing from the at least one flux concentrator to the at least one vector type magnetic sensor will decrease so as to modulate the output of the sensor to the processor.

10. A modulating magnetic field device comprising:
a base structure;
a processor;
a rotating member that rotates about an axis;
at least one flux concentrator operatively connected to the rotating member having a longitudinal axis in the radial direction of the rotating member;
at least one vector-type magnetic sensor fixedly mounted in the near proximity to said axis and operatively connected to said processor so as to provide output to the processor;
the at least one magnetic sensor having configured to detect a magnetic field in the direction of a predetermined vector;
whereby as the at least one flux concentrator revolves around the magnetic sensor, when the longitudinal axis of the at least one flux concentrator is in alignment with direction of the predetermined vector, the magnetic field flowing from the at least one flux concentrator to the at least one vector-type magnetic sensor is at a maximum and when the at least one flux concentrator rotates away from this aligned position, the magnetic field flowing from the at least one flux concentrator to the at least one vector type magnetic sensor will decrease so as to modulate the output of the sensor to the processor.

11. The device of claim 10 wherein the at least one flux concentrator moves at a predetermined rotation rate thereby minimizing 1/f-type noise.

12. The device as recited in claim 10, wherein the at least one magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

13. The device of claim 10 wherein the rotating member is a disk.

14. The device of claim 10 wherein the rotating member is a donut-shaped disk and there is only one vector-type magnetic sensor positioned within the hole of the donut-shaped disk.

15. The device of claim 10 further comprising at least X flux concentrators positioned equidistantly radially on the rotating member, where X is a number >8, whereby the magnetic field sensed by the at least one vector-type magnetic sensor senses changes from one maximum to another each time the rotating member rotates 360/X degrees.

16. The device of claim 10 wherein the rotating member is a donut-shaped disk divisible into at least eight sectors, and wherein each sector has at least one flux concentrator located therein positioned equidistantly with its longitudinal axis aligned in a radial direction.

17. The device of claim 10 further including at least one flux concentrator fixedly positioned adjacent to the rotating member for transference of the magnetic field to the at least one flux concentrator on the rotating member, the at least one fixed flux concentrator operating to transfer the maximum amount of flux when the longitudinal axes of each of the at least one fixed flux concentrator is nearest and in alignment with the at least one flux concentrator on the rotating member.

18. The device of claim 17 wherein the magnetic field detected by the at least one vector-type magnetic sensor is modulated as the rotating member rotates from a first position when the at least one fixed flux concentrator is nearest and in alignment with the at least one flux concentrator on the rotating member to a second position when the at least one fixed flux concentrator is furthest from being in alignment with the at least one flux concentrator on the rotating member; the magnetic flux detected by the at least one vector-type magnetic sensor being at a maximum in the first position and at a minimum in the second position.

19. The device of claim 18 wherein the amount of rotation of the rotating member from the first position to the second position is 360 degrees divided by 2X where X is the number of flux concentrators on the rotating member.

20. The device of claim 19 wherein the modulation rate is proportional to the number of flux concentrators on the rotating member.

* * * * *